(12) United States Patent
Tomishima

(10) Patent No.: US 6,861,708 B2
(45) Date of Patent: Mar. 1, 2005

(54) SEMICONDUCTOR MEMORY DEVICE HAVING A LOW POTENTIAL BODY SECTION

(75) Inventor: Shigeki Tomishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/383,578

(22) Filed: Mar. 10, 2003

(65) Prior Publication Data

US 2004/0056308 A1 Mar. 25, 2004

(30) Foreign Application Priority Data

Sep. 20, 2002 (JP) ........................................ 2002-275444

(51) Int. Cl.⁷ .............................................. H01L 27/01
(52) U.S. Cl. ...................... 257/347; 257/348; 257/349
(58) Field of Search ................................. 257/347, 348, 257/349, 350, 351–354; 365/149

(56) References Cited

U.S. PATENT DOCUMENTS

| | | | | |
|---|---|---|---|---|
| 5,148,393 A | * | 9/1992 | Furuyama | 365/149 |
| 5,821,769 A | * | 10/1998 | Douseki | 326/34 |
| 6,104,061 A | * | 8/2000 | Forbes et al. | 257/330 |
| 6,111,778 A | * | 8/2000 | MacDonald et al. | 365/149 |
| 6,191,470 B1 | * | 2/2001 | Forbes et al. | 257/621 |
| 6,458,638 B2 | * | 10/2002 | Kim | 438/157 |
| 6,538,916 B2 | * | 3/2003 | Ohsawa | 365/149 |
| 6,624,476 B1 | * | 9/2003 | Chan et al. | 257/347 |
| 6,646,305 B2 | * | 11/2003 | Assaderaghi et al. | 257/347 |
| 6,670,675 B2 | * | 12/2003 | Ho et al. | 257/347 |
| 6,677,676 B1 | * | 1/2004 | Wada et al. | 257/734 |

FOREIGN PATENT DOCUMENTS

JP        11-87728        3/1999

OTHER PUBLICATIONS

Stephen C. Kuehne et al., "SOI MOSFET with Buried Body Strap by Wafer Bonding," IEEE Transactions on Electron Devices, May 1998, pp. 1084–1091, vol. 45, No. 5.

* cited by examiner

Primary Examiner—Long Pham
Assistant Examiner—Thao X Le
(74) Attorney, Agent, or Firm—Burns, Doane, Swecker & Mathis, L.L.P.

(57) ABSTRACT

This semiconductor device is provided with a wiring called a body line (BDL), a body section of a memory cell transistor is connected to this body line (BDL), and a potential of the body section is controlled by a body section controller connected to the body line. As a result, it is possible to propose a novel structure capable of keeping the potential of the body section low and to provide a semiconductor device and a manufacturing method therefor, capable of improving operation performance by contriving circuit operation.

8 Claims, 16 Drawing Sheets

LEVEL SHIFTER [2]

US 6,861,708 B2

SEMICONDUCTOR MEMORY DEVICE HAVING A LOW POTENTIAL BODY SECTION

BACKGROUND OF THE INVENTION

1. Field of the Invention

The present invention relates to a semiconductor device and a manufacturing method therefor, and more specifically to a structure of a semiconductor device for improving the operation performance of the semiconductor device, and a manufacturing method for obtaining the structure.

2. Description of the Background Art

FIG. 26 shows a circuit diagram of a conventional SOI (Semiconductor On Insulator) type DRAM Dynamic Random Access Memory) cell 100B. A conventional memory cell transistor consists of an n-channel MOS (Metal Oxide Semiconductor) transistor 100. A memory cell capacitor 101 is connected to one end of n-channel MOS transistor 100. A bit line BL is connected to the other end of n-channel MOS transistor 100. The operation of SOI type DRAM cell 100B is such that cell 100B controls a word line WL which is the gate node of n-channel MOS transistor 100, accumulates charges in memory cell capacitor 101 by bit line BL and stores the charges as cell data.

FIG. 27 shows the cross-sectional structure of a DRAM cell 100C which employs an SOI type memory cell transistor. A silicon oxide film ($SiO_2$) is formed on a silicon substrate 1, and a memory transistor is provided on silicon oxide film 2. A pair of n-type impurity regions 4 and 5, between which a p-type body section 3 is put, are provided on the main surface of silicon oxide film 2. A gate electrode 6 of a word line WL node is provided on body section 3 through a gate oxide film 7. A bit line 15 is connected to n-type impurity region 4 through a contact plug 13 which is provided in an interlayer insulating film 14. A memory cell capacitor 12 is connected to n-type impurity region 5 through a contact plug 8 which is provided in interlayer insulating film 14. Memory cell capacitor 12 includes a storage node (lower electrode) 9, a dielectric film 10, and a cell plate (upper electrode) 11.

The parasitic capacitance of the SOI type memory cell transistor is lower than that of an ordinary bulk type memory transistor, the power consumption thereof is lower and the rate thereof is higher since pn junctions are only on the interfaces between p-type body section 3 and n-type impurity regions 4 and 5. Further, because of the barrier effect of silicon oxide film 2, the SOI memory cell transistor is superior to the ordinary bulk type memory transistor in soft error resistance which is an important factor for a memory chip.

However, as shown in FIG. 27, the SOI type memory cell transistor has a so-called floating structure in which body section 3 is not connected to the other nodes, and charges are accumulated in body section 3 by junction leak current on bit line (BL) 15 side and storage node (SN) 9 side. As a result, as shown in FIG. 28, the potential of body section 3 of the SOI type memory cell transistor rises, an increase in channel leak is induced, and the refresh characteristic of the DRAM cell is eventually, disadvantageously deteriorated.

Conventionally, body section 3 has been stabilized by extracting charges by the amplitude of the bit line to regularly decrease (stabilize) the potential of body section 3 (body refresh), or by providing a gate node region (BG) 21 on the rear side of body section 3 (a deeper region than body section 3 of silicon oxide film 2) to decrease the potential of body section 3 as seen in a memory cell transistor employed in a DRAM cell 100D shown in the cross-sectional view of FIG. 29 and the circuit model diagram of FIG. 30.

Nevertheless, the structure of body section 3 remains a floating structure, and the potential of body section 3 increases by junction leak as shown in FIG. 28. Thus, these methods have not been able to essentially solve the disadvantages.

SUMMARY OF THE INVENTION

It is an object of the present invention to propose a novel structure capable of keeping the potential of a body section low, and to provide a semiconductor device and a manufacturing method for semiconductor device, capable of improving the operation performance of the semiconductor device by contriving circuit operation A semiconductor device according to the present invention is a semiconductor device which includes a transistor provided on a silicon substrate through an insulating layer and has a gate electrode provided on the insulating layer through a gate insulating film and a pair of impurity regions provided in the insulating layer, includes: a body section including a region interposed between the pair of impurity regions; an embedded body line connected to the body section; and a body section controller, which is connected to the embedded body line, for controlling a potential applied to the body section in relation to a potential applied to the gate electrode.

With this configuration, it is possible to control the potential of the body section by the body section controller, and to solve the floating of the potential of the body section which has been the disadvantage of the conventional SOI type semiconductor device.

A manufacturing method for a semiconductor device according to the present invention includes the steps of: forming an insulating film on a first silicon substrate, and forming a silicon layer on the insulating film; forming an isolation insulating layer in a predetermined region of the silicon layer, and specifying a region which becomes an embedded body line; injecting impurities into the region which becomes the embedded body line, and completing the embedded body line; bonding a second silicon substrate onto a surface of the insulating film; reducing a film thickness of the second silicon substrate, and forming a new silicon surface; and forming a transistor on the new silicon surface, the transistor having a pair of impurity regions located on a higher layer than the embedded body line, and a gate electrode extending in the same direction as that of the embedded body line.

According to the manufacturing method for a semiconductor device, it is possible to apply the ordinary semiconductor device manufacturing process to the method only by adding the first embedded body line formation process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of a semiconductor device and a manufacturing method for semiconductor device according to the present invention will be described with reference to the drawings.

First Embodiment

Figure 1:
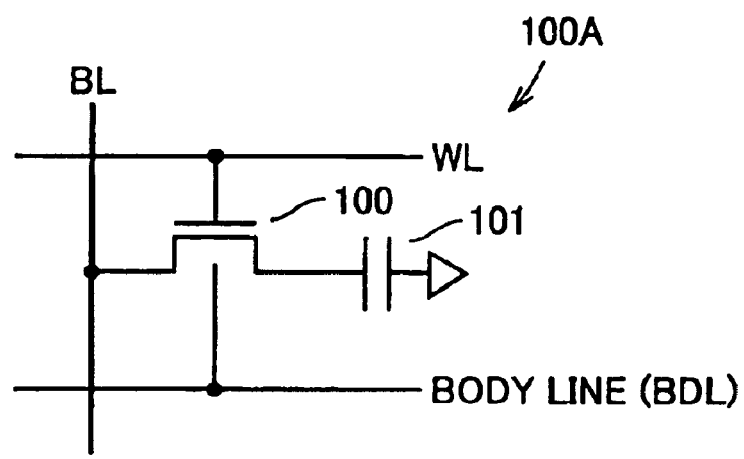
FIG. 1 is a circuit model diagram of a semiconductor device according to a first embodiment.
Figure 2:
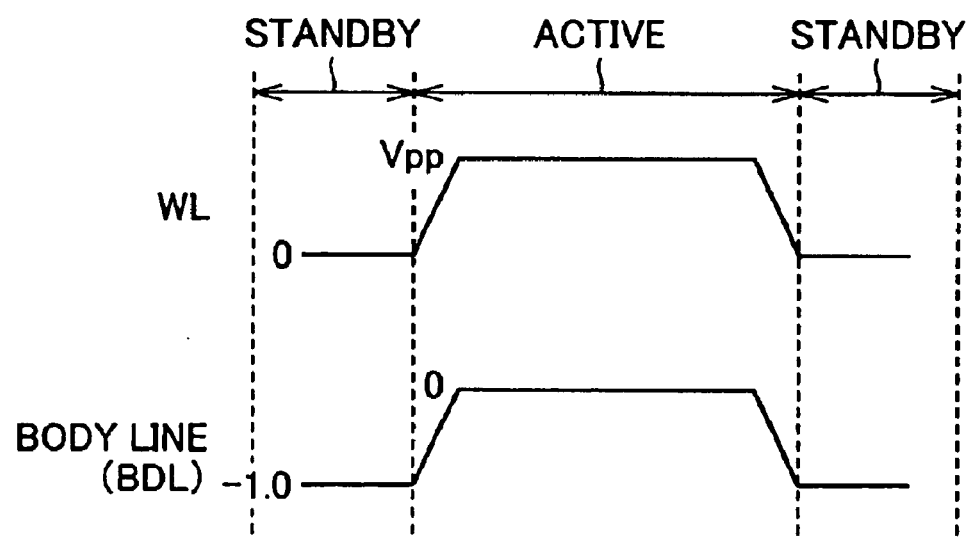
FIG. 2 is a timing chart showing the potentials of a word line and body line of the semiconductor device according to the first embodiment.
Figure 3:
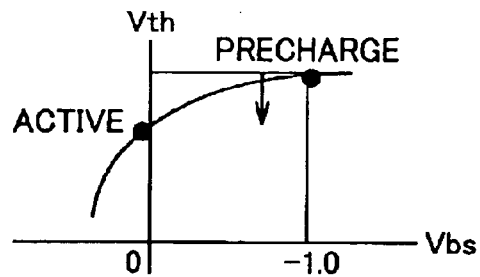
FIG. 3 is a graph showing the relationship between a Vbs (body line applied voltage) and a Vth (threshold voltage) of the semiconductor device according to the first embodiment.

Referring to FIGS. 1 to 3, the structure of a semiconductor device according to a first embodiment will be described. It is noted that the same constituent elements of a memory cell transistor employed in a DRAM cell as those of the conventional DRAM cell are denoted by the same reference symbols, respectively and will not be repeatedly described herein.

First, referring to FIG. 1, the constituent elements of the memory cell transistor of the semiconductor device according to the first embodiment differ from those of the conventional memory cell transistor in that a wiring called a body line (BDL) is provided, a body section of memory cell transistor 100A is connected to body line BDL, and the potential of the body section is controlled by a body section controller 36 (see FIG. 8) connected to body line BDL.

As shown in FIG. 1, body line BDL is provided at the same pitch in the same direction as a word line (WL), and the body section of memory cell transistor 100A selected by word line WL is connected to body line BDL.

As shown in FIG. 2, the potential of the body section is controlled by rocking the potential of body line BDL between first and second potentials. Specifically, if a potential applied to word line WL is in an inactive (a standby) state, a potential applied to body line BDL is set at a low potential (first potential) of negative potential (e.g., –1.0 V), thereby floating the potential of the body section by the floating body effect and solving the disadvantage of deteriorating the data holding characteristic of the memory cell.

If the potential applied to word line WL is active, the potential applied to body line BDL is set at a higher potential (second potential, e.g., 0 V) than the negative potential to which the potential of the body line (BDL) is fixed in the standby state. As shown in FIG. 3, this operation can decrease the threshold voltage (Vth) of memory cell transistor 100A, and improve the driving ability thereof. Thus, it can be expected to read and write data at high rate.

Further, by decreasing the threshold voltage of memory cell transistor 100A, the High level voltage (Vpp) of word line WL can be decreased, so that the reliability of the memory cell transistor can be improved. In addition, by controlling body line BDL to connect only the same cell as that selected by word line WL, other unselected memory cell transistors 100A are not activated. Therefore, it is possible to float the body potentials of other inactive memory cell transistors 100A and to prevent the deterioration of the data holding characteristics of DRAM. In other words, it is possible to maintain the data holding characteristic of bulk DRAM while maintaining the high rate characteristic of the SOI transistor.

Concrete Example of Body Line Driver Circuit

The concrete example of a body line driver circuit will be described with reference to FIGS. 4 to 7.

The potential of body line BDL is 0V when word line WL is active and –1.0 V when word line WL is inactive. Therefore, the potential amplitude of the body line driver circuit needs to have H level: 0 V and L level: –1.0 V.

A signal for activating word line WL is normally obtained by changing a signal having an amplitude of 0(V) to Vdd(V) to a signal having an amplitude of 0(V) to Vbb(V). Thus, using the original signal having an amplitude of 0(V) to Vdd(V), a body signal is generated by a circuit configuration shown in, for example, FIG. 4.

Figure 4:
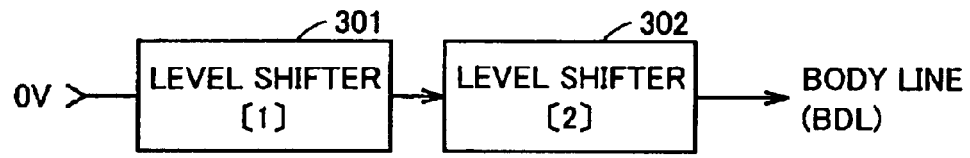
FIG. 4 is a conceptual view showing a body line driver circuit according to the first embodiment.
Figure 5:
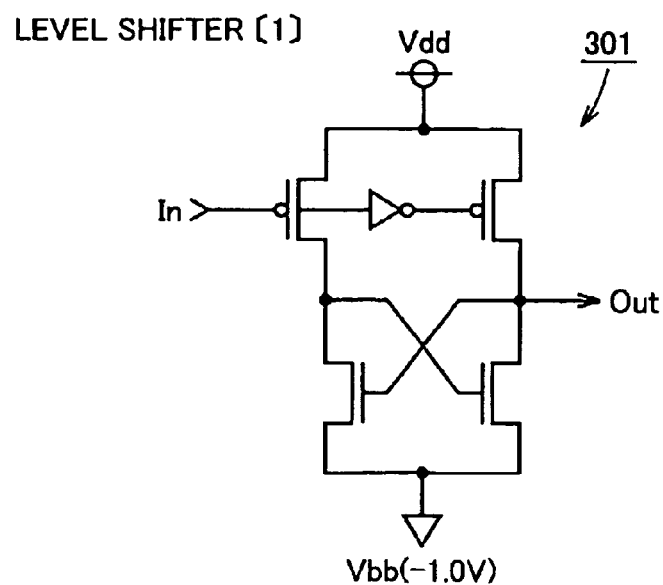
FIG. 5 is a circuit diagram of a level shifter (1) according to the first embodiment.
Figure 6:
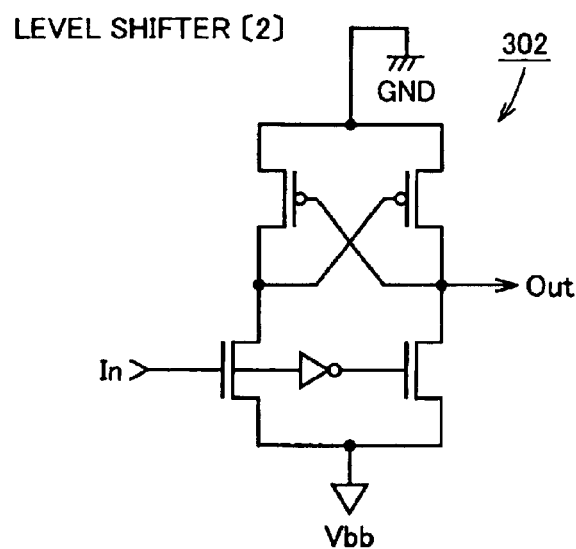
FIG. 6 is a circuit diagram of a level shifter (2) according to the first embodiment.

In FIG. 4, a level shifter [1] 301 is a circuit which shifts a signal having an amplitude of 0(V) to Vdd(V) to a signal having an amplitude of Vbb(V) (–1.0V) to Vdd(V) (see FIG. 5). A level shifter [2] 302 is a circuit which shifts a signal having an amplitude of Vbb(V) to Vdd(V) into a signal having an amplitude of Vbb(V) to 0(V) (see FIG. 6). Therefore, the signal having an amplitude of 0(V) to Vbb(V) can be obtained from the original signal having an amplitude of 0(V) to Vdd(V).

Figure 7:
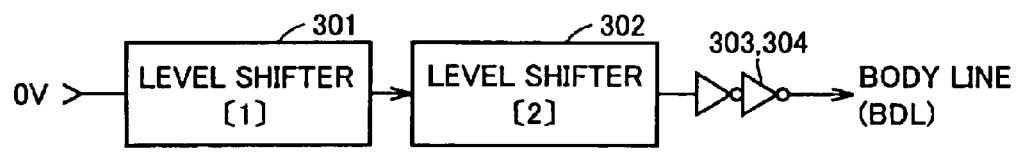
FIG. 7 is a conceptual view showing a modification of the body line driver circuit according to the first embodiment.

In the body line driver circuit shown in FIG. 4, since level shifters [1] 301 and [2] 302 are mainly intended to shift level, transistor size is often small. In this case, parasitic load on body line BDL may possibly become heavy. Considering this, it is possible to provide inverters 303 and 304 which drive such heavy parasitic load in rear of level shifter [2] 302 as shown in FIG. 7.

Second Embodiment

Figure 8:
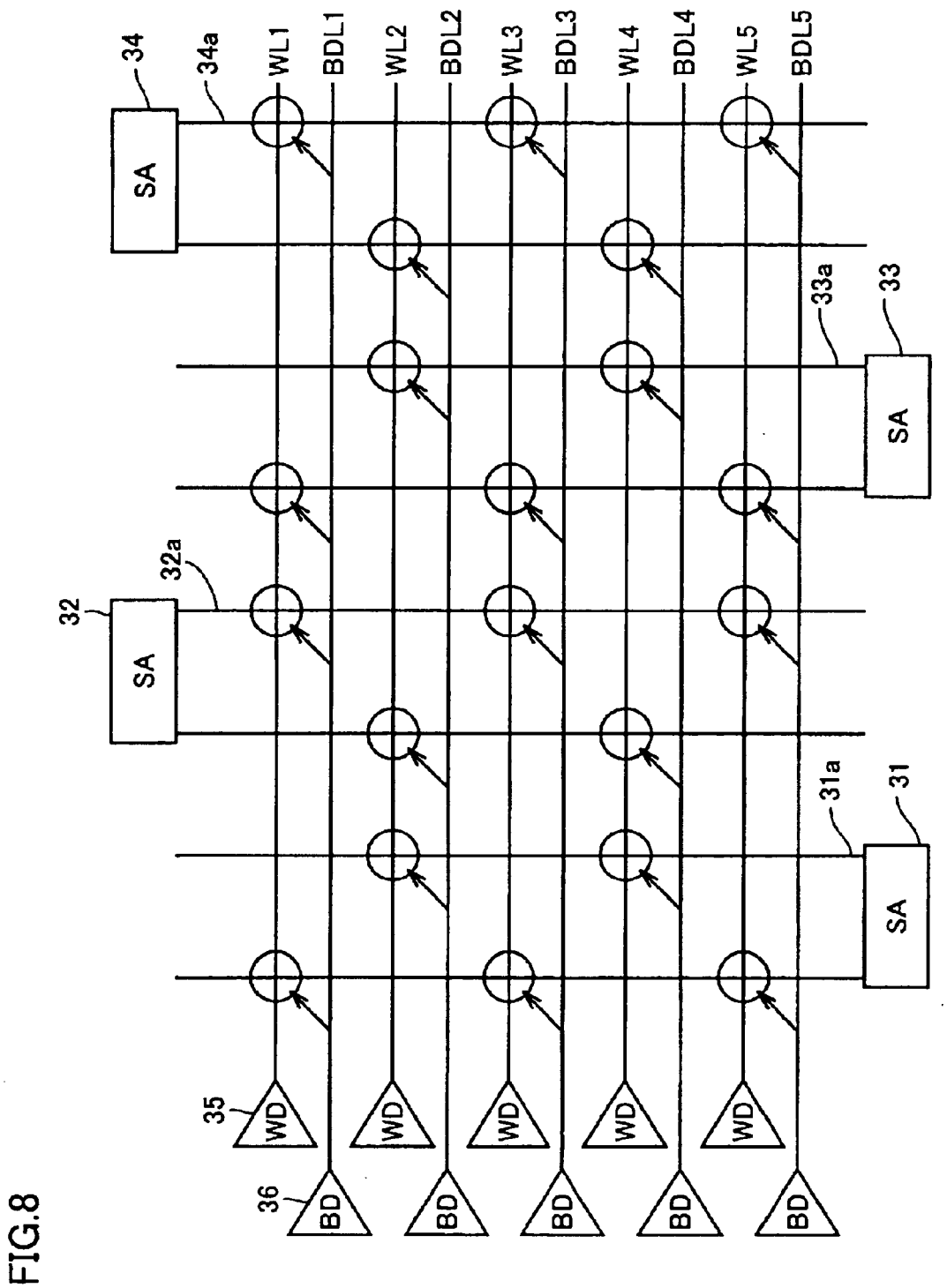
FIG. 8 is a plan view showing the array configuration of a DRAM according to a second embodiment.

As a second embodiment, the configuration of the array of DRAM (Dynamic Random Access Memory) based on the operation principle according to the first embodiment will be described with reference to FIG. 8. In FIG. 8, memory cell transistors 100A are provided in a matrix in portions denoted by circles, respectively. Memory cell transistors 100A are present at the intersections between bit line pairs (31a to 34a) and word lines (WL1 to WL5), respectively, which intersections are connected to memory cell sense amplifiers SA 31 to 34. FIG. 8 shows one example of the configuration of the array in which folded bit lines at half cell pitches are provided.

Word line drivers WD 35 are connected to word lines WL1 to WL5 to drive respective word lines WL1 to WL5. Body drivers BD 36 are connected to body lines BDL1 to BDL5 arranged in parallel to word lines WL1 to WL5 to drive respective body lines BDL1 to BDL5. Similarly to word lines WL1 to WL5, adjacent body lines BD1 to BD5 are isolated from each other by insulating films, respectively. Body lines BL1 to BDL5 are connected only to the body sections of memory cell transistors 100A selected by word lines WL1 to WL5, respectively. By employing this array configuration, it is possible to realize the array of DRAM having body lines BDL as described in the first embodiment.

Third Embodiment

As a third embodiment, the structure of the half-pitch cell layout employed in the DRAM array having body lines BDL according to the second embodiment will be described with reference to FIGS. 9 to 12.

Figure 9:
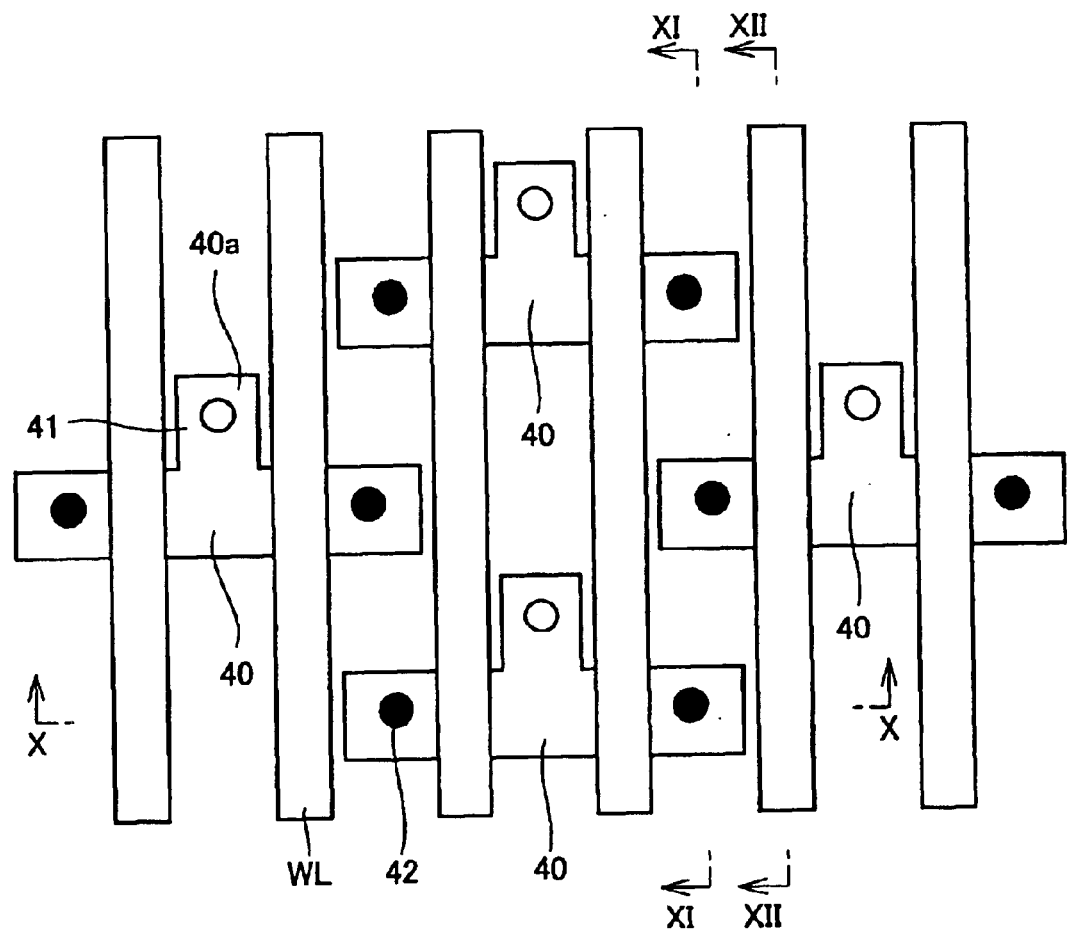
FIG. 9 is a partially enlarged plan view showing the half-pitch cell layout structure according to a third embodiment.

First, referring to FIG. 9, the DRAM array includes active regions 40 having convex plane shapes and word lines WL arranged at predetermined intervals along a longitudinal direction (a direction in which the convex regions 40a of active regions 40 extend). A white circle mark 41 shown in convex region 40a of active region 40 denotes a contact region with bit line BL, and a black circle mark 42 in active region 40 denotes a contact region with the storage node of a cell capacitor. Although not shown in FIG. 9, bit lines BL are arranged in a direction orthogonal to word lines WL (a lateral direction). Further, in a plan view, body lines BDL are provided as embedded wirings arranged almost at the same positions as those of word lines WL which are arranged in the longitudinal direction, in the same direction as that of word lines WL.

Figure 10:
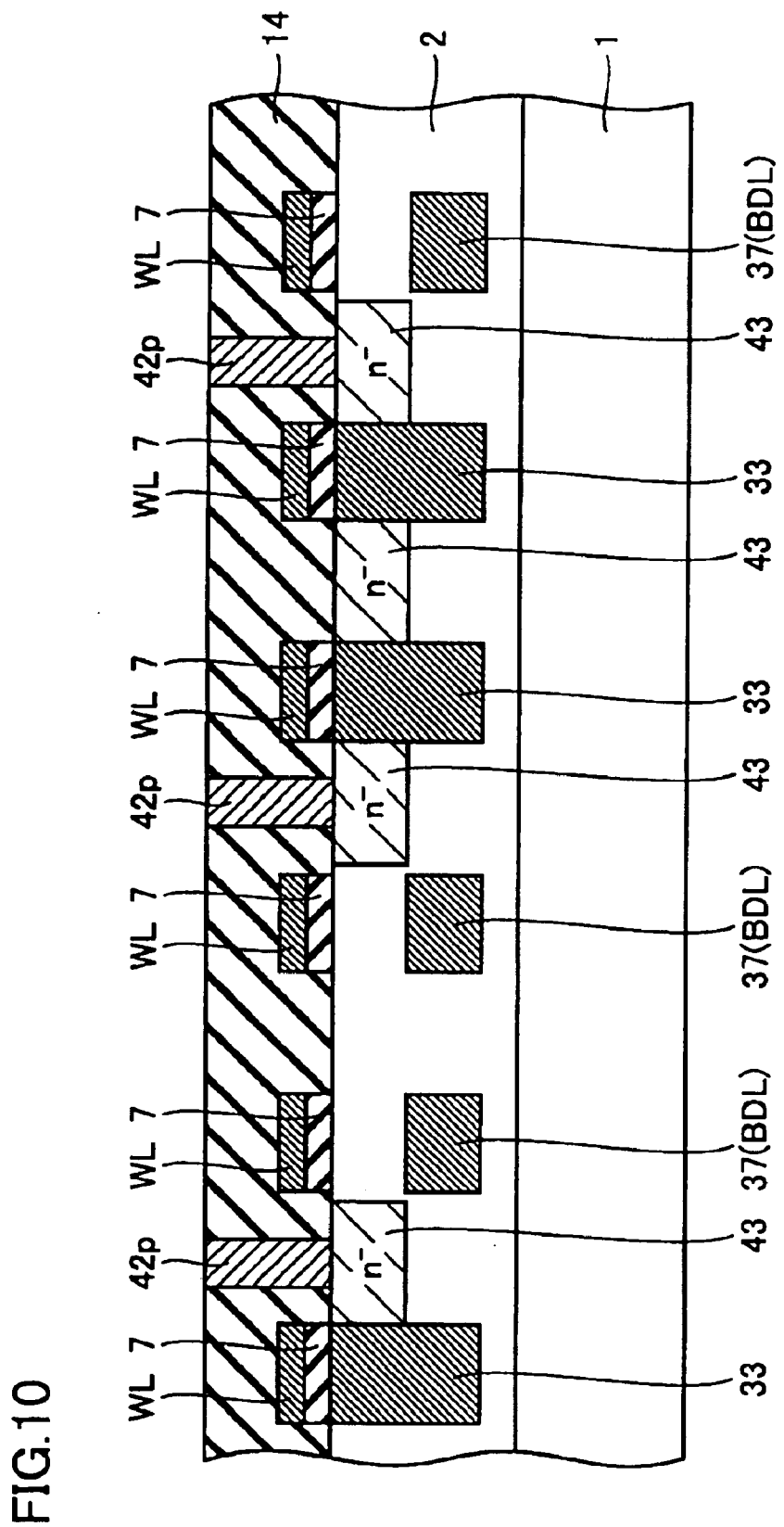
FIG. 10 is a cross-sectional view taken along line X—X of FIG. 9.
Figure 11:
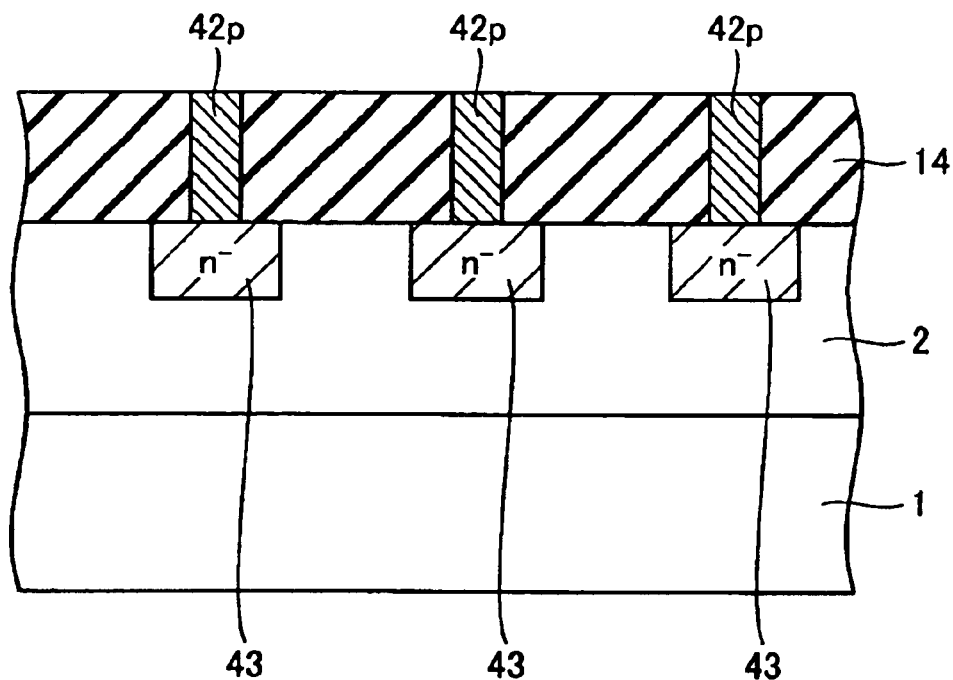
FIG. 11 is a cross-sectional view taken along line XI—XI of FIG. 9.
Figure 12:
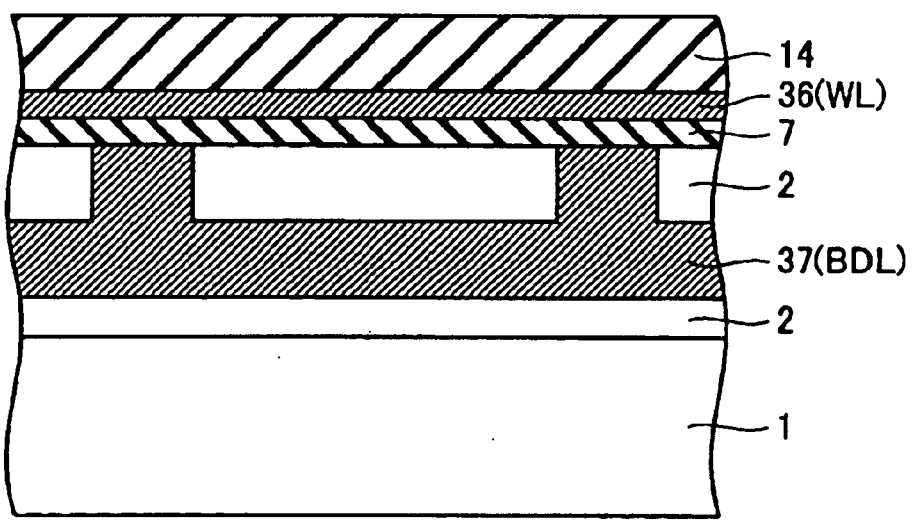
FIG. 12 is a cross-sectional view taken along line XII—XII of FIG. 9.

Referring to FIGS. 10 to 12, the cross-sectional structure of the DRAM array will be described. Each word line WL is arranged on silicon oxide film ($SiO_2$) 2 formed on silicon substrate 1 through a gate oxide film 7. Word lines WL are arranged equidistantly on silicon oxide film 2. On the main surface of silicon oxide film 2, memory cell transistors each having word line WL as a gate electrode and an n-impurity region 43 as a source/drain region are constituted in portions in which n-type impurity regions 43 are provided to put word lines WL therebetween, respectively.

A contact electrode 42p connected to the storage node of a cell capacitor is connected to one n-type impurity region 43 and a contact electrode (not shown) connected to bit line BL is connected to the other n-type impurity region 43, with word line WL, which constitutes the gate electrode, put between two n-type impurity regions 43.

A p-type impurity region put between n-type impurity regions 43 constitutes a body section 33. The impurity diffusion depth of body section 33 is set to be larger than that of n-type impurity region 43.

As shown in FIG. 12, in silicon oxide film 2, an embedded body line BDL 37 is formed in a region deeper than body section 33 in the same direction as the extension direction of word line WL.

By forming body line BDL 37 as an embedded wiring, it is possible to employ body line BDL equal in shape to ordinary word line WL without the need to arrange body line BDL 37 adjacent the active region of the memory cell transistor. As a result, it is possible to realize the half-pitch cell array configuration employed for ordinary DRAM cells without any problems.

Fourth Embodiment

As a fourth embodiment, the manufacturing steps of manufacturing a memory cell transistor including embedded body line BDL as described as in the third embodiment will be described with reference to FIGS. 13 to 22.

Figure 13:
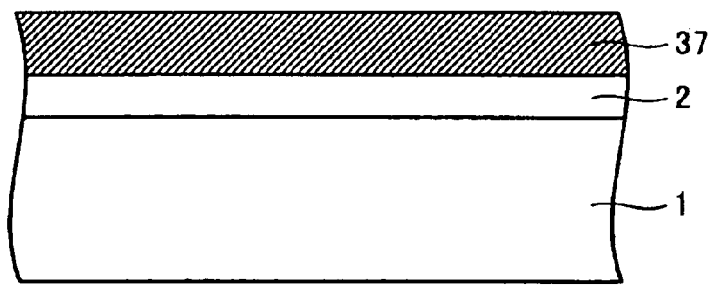
FIGS. 13 to 22 are cross-sectional views showing first to tenth manufacturing steps of a semiconductor device according to a fourth embodiment, respectively.
Figure 14:
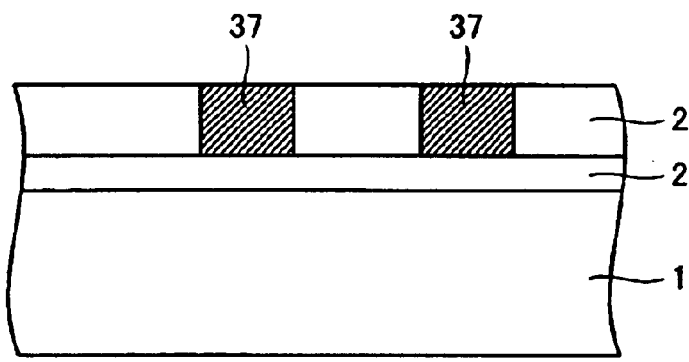
Figure 15:
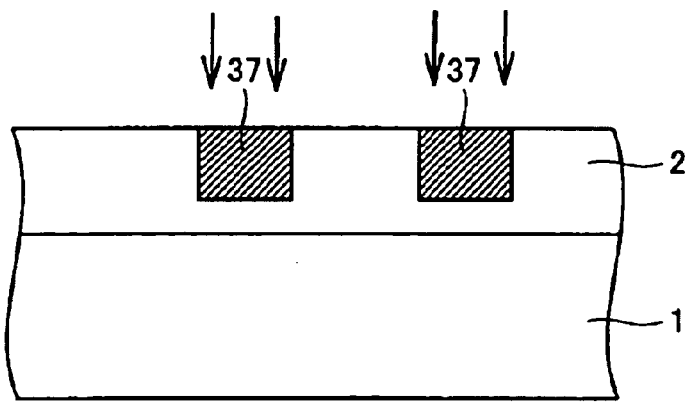

Referring to FIG. 13, silicon oxide film ($SiO_2$) 2 is formed on first silicon substrate 1, and a silicon layer (Si) 40 is formed on silicon oxide film ($SiO_2$) 2, thereby forming a bare SOI wafer. Referring to FIG. 14, predetermined regions of silicon layer 40 are then oxidized to form silicon oxide film ($SiO_2$) 2 as an isolation insulating layer, thereby specifying regions which become embedded body lines BDL 37 having a thickness of about 100 nm. Referring to FIG. 15, p-type impurities (B, $BF_2$ or the like) are injected only into the regions which become embedded body lines BDL 37 to complete embedded body lines BDL 37. If the p-type impurities are Boron (B) impurities, impurity injection conditions are injection energy of 5 kev to 30 kev and injection quantity of $1 \times 10^{15}$ $cm^{-2}$ to $1 \times 10^{16}$ $cm^{-2}$.

Figure 16:
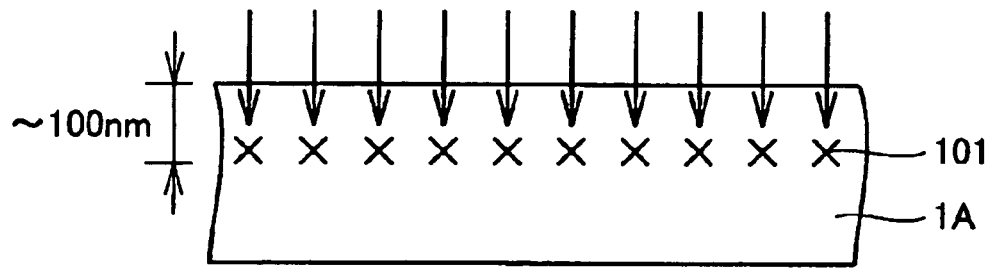
Figure 17:
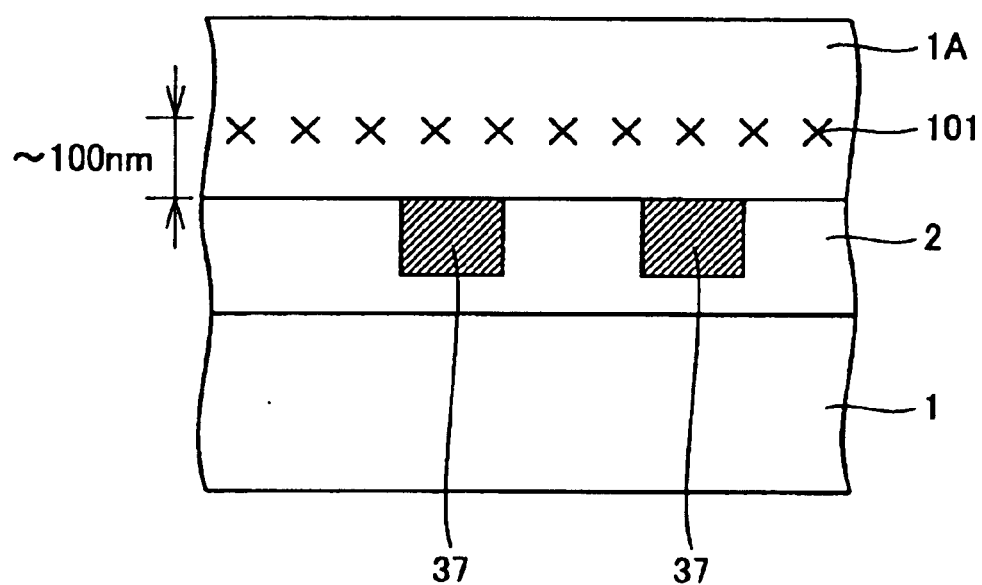

Referring to FIG. 16, a second silicon substrate 1A is then prepared. Hydrogen is introduced from the surface of second silicon substrate 1A to generate a wall broken region 101 having a depth of 100 nm. The hydrogen injection conditions are injection energy of about 1 kev to 10 kev and injection quantity of about $3.5 \times 10^{16}$ $cm^{-2}$ to $1 \times 10^{17}$ $cm^{-2}$. Thereafter, referring to FIG. 17, second silicon substrate 1A is bonded onto the surface of silicon oxide film ($SiO_2$) 2 with second silicon substrate 1A turned upside down.

Figure 18:
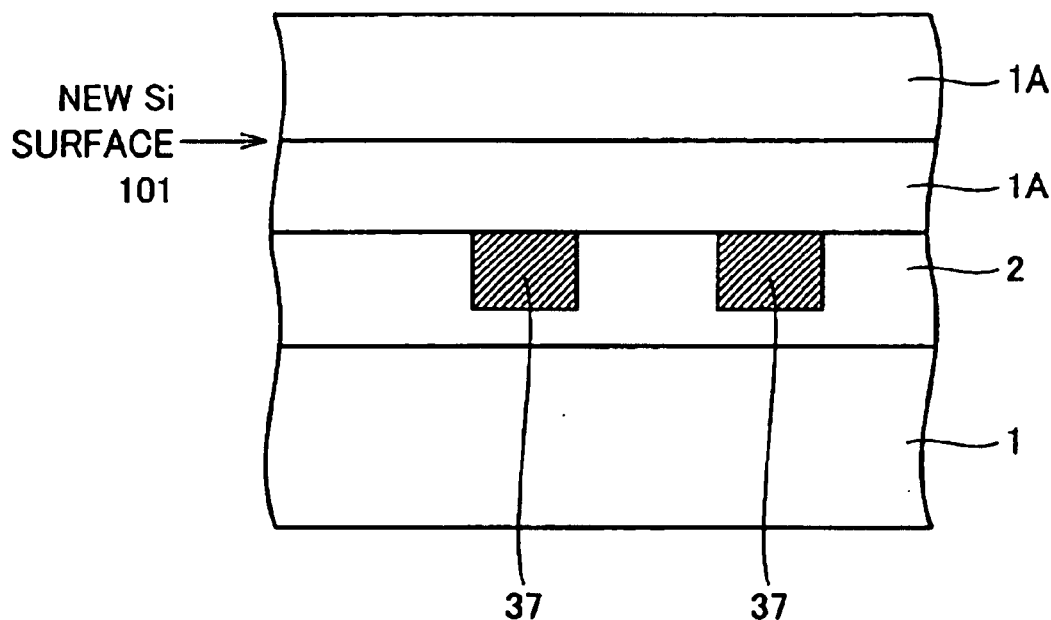

Since a silicon layer for forming an ordinary SOI transistor is thin (1000 angstrom to 2000 angstrom), silicon substrate 1A located above the wall broken region (new silicon surface) 101 provided in the intermediate region of second silicon substrate 1A is cut off (see FIG. 18). The thickness of second silicon substrate 1A having the new silicon surface is about 50 nm to 100 nm.

Figure 19:
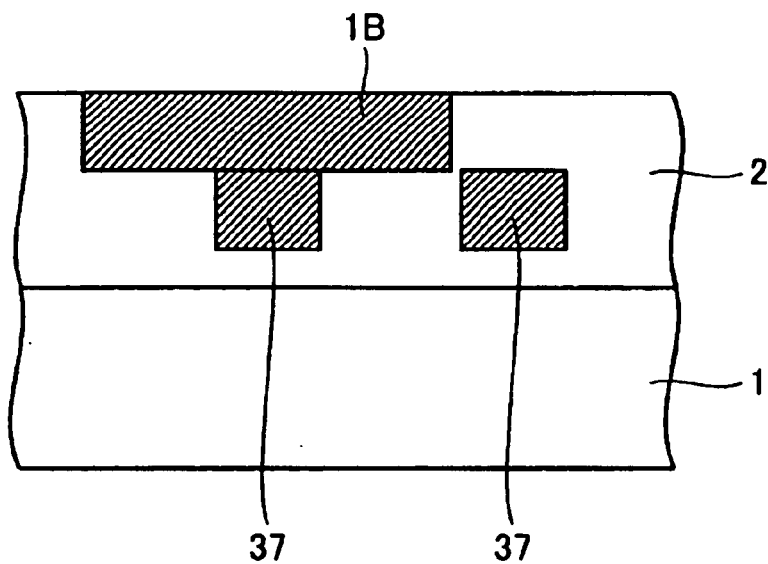
Figure 20:
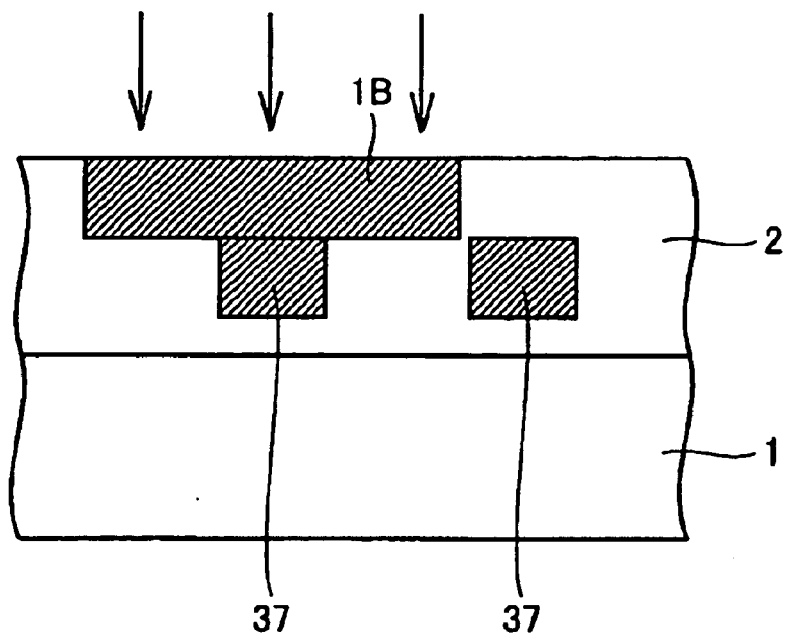

Next, new silicon substrate 1A is subjected to ordinary SOI type memory cell transistor formation steps. Referring to FIG. 19, silicon oxide film ($SiO_2$) 2 is first formed in a predetermined region and an active region of the memory cell transistor is specified by trench isolation. Thereafter, p-type impurities (B, $BF_2$ or the like) are injected into active region 1B. If the p-type impurities are Boron (B) impurities, the p-type impurity injection conditions are injection energy of about 5 kev to 30 kev and injection quantity of about $1 \times 10^{12}$ $cm^{-2}$ to $3 \times 10^{13}$ $cm^{-2}$. As a result of the injection of the p-type impurities, active region 1B which becomes body section 33 is electrically connected to embedded body line BDL 37.

Figure 21:
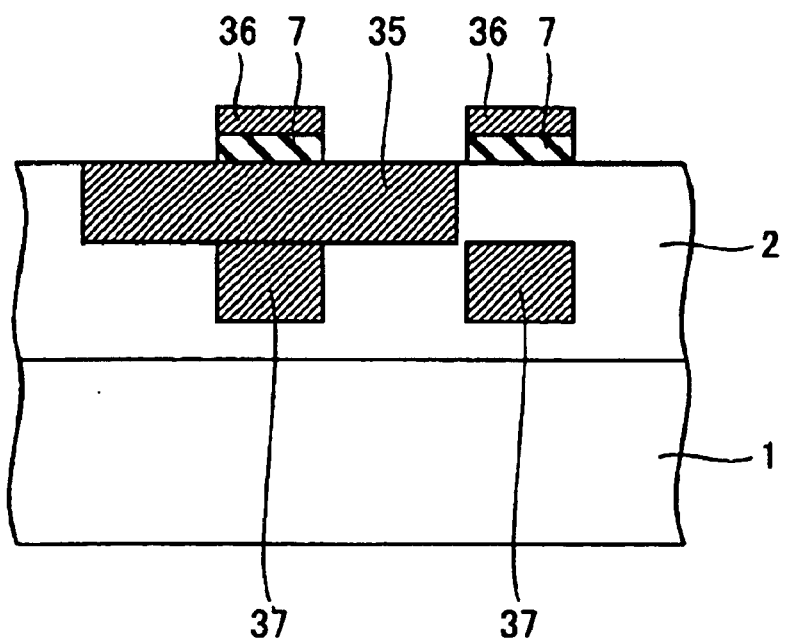
Figure 22:
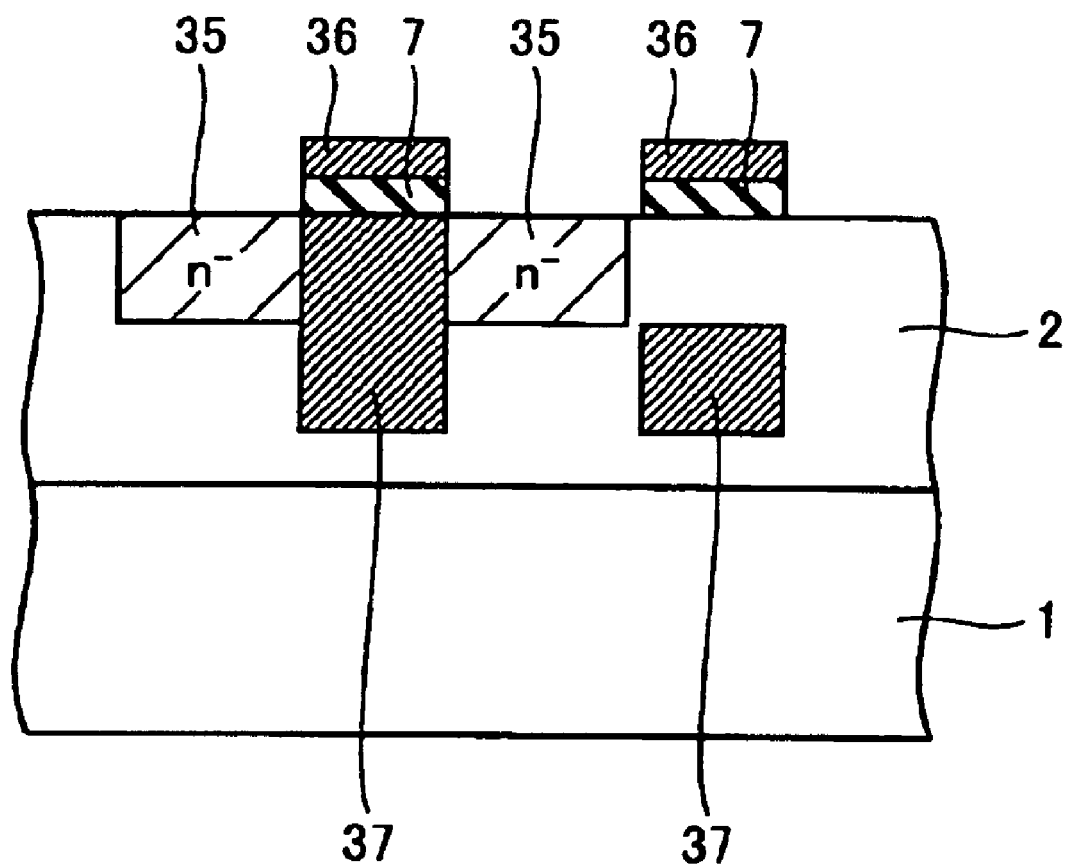

Referring to FIG. 21, a gate electrode 36 which becomes word lines WL is formed on active region 1B through gate oxide film 7. Referring to FIG. 22, n-type impurities (P, As or the like) are injected into active region 1B to form n-type impurity region 43 and specify p-type body section 33 by using gate electrode 36 as a mask. If the n-type impurities are As impurities, the n-type impurity injection conditions are injection energy of about 20 kev to 50 kev and injection quantity of about $5 \times 10^{13}$ $cm^{-2}$ to $1 \times 10^{16}$ $cm^{-2}$.

Through the above-stated steps, an SOI type memory cell transistor including embedded body line BDL 37 is completed. In the following formation of a memory cell capacitor, an ordinary DRAM process flow can be employed.

Therefore, in this embodiment, it is possible to apply ordinary SOI type memory cell transistor formation process and DRAM memory cell formation process to the manufacturing process of manufacturing an SOI type memory cell transistor including embedded body line BDL as they are by adding the first body line BDL formation process.

In the above-stated manufacturing process, the wall broken region by injecting hydrogen is employed to form bare silicon substrate 1A having a new silicon surface. Alternatively, it is possible to employ a process of polishing a silicon wafer by CMP (Chemical Mechanical Polishing) and forming bare silicon substrate 1A having a new silicon surface. Further, in the above-stated manufacturing process, monocrystalline silicon of the SOI wafer is used to form embedded body line BDL 37. The same function and advantage can be attained by using polysilicon (polycrystalline silicon).

Fifth Embodiment

Figure 23:
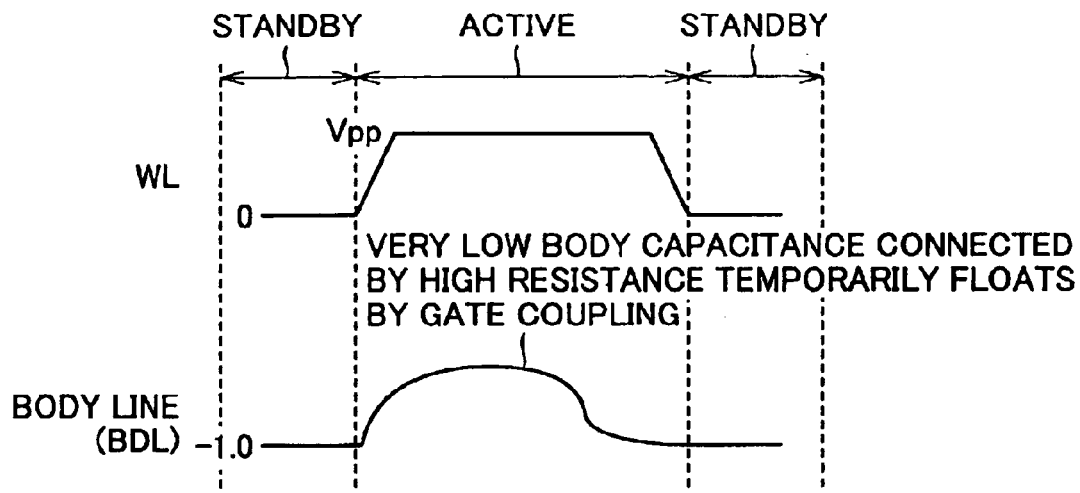
FIG. 23 is a timing chart showing the potentials of a word line and body line of a semiconductor device according to a fifth embodiment.

In a first embodiment, body line BDL is dynamically rocked between the high negative voltage (−1.0 V) and 0 V synchronously with the activation of word line WL as shown in FIG. 2. In the fifth embodiment, the voltage of body line BDL is fixed to a high negative voltage (e.g., −1.0 V) (first potential) as shown in FIG. 23.

Figure 24:
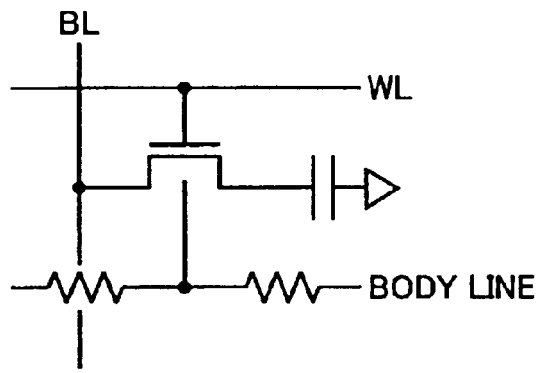
FIG. 24 is a circuit model diagram of the semiconductor device according to the fifth embodiment.
Figure 25:
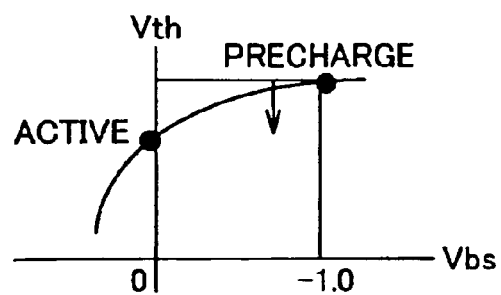
FIG. 25 is a graph showing the relationship between Vbs (body line applied voltage) and Vth (threshold voltage) of the semiconductor device according to the fifth embodiment.
Figure 26:
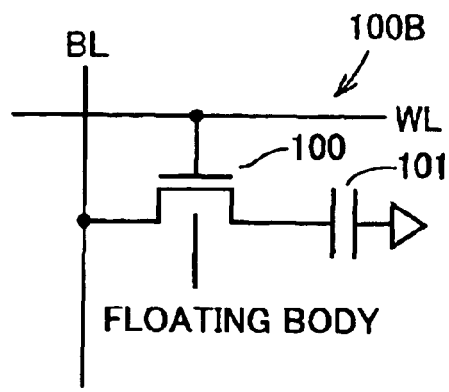
FIG. 26 is a circuit model diagram of a conventional semiconductor device.
Figure 27:
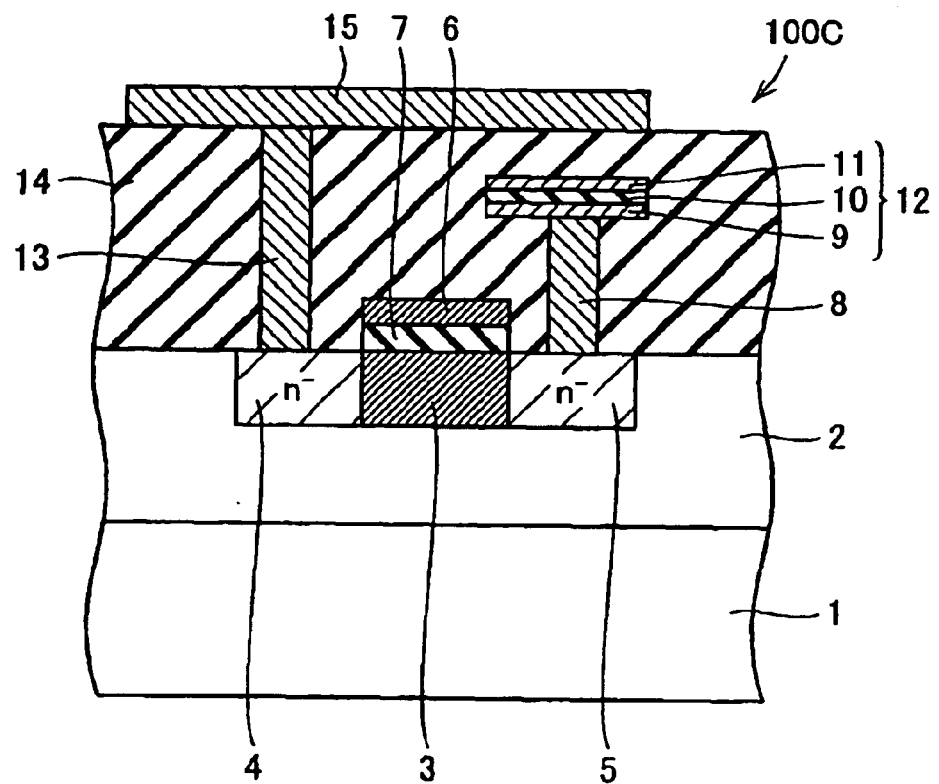
FIG. 27 is a cross-sectional view showing the structure of the conventional semiconductor device.
Figure 28:
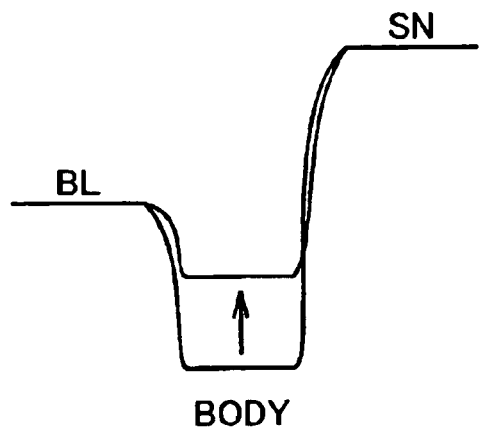
FIG. 28 is a schematic view showing a disadvantage of the conventional semiconductor device.
Figure 29:
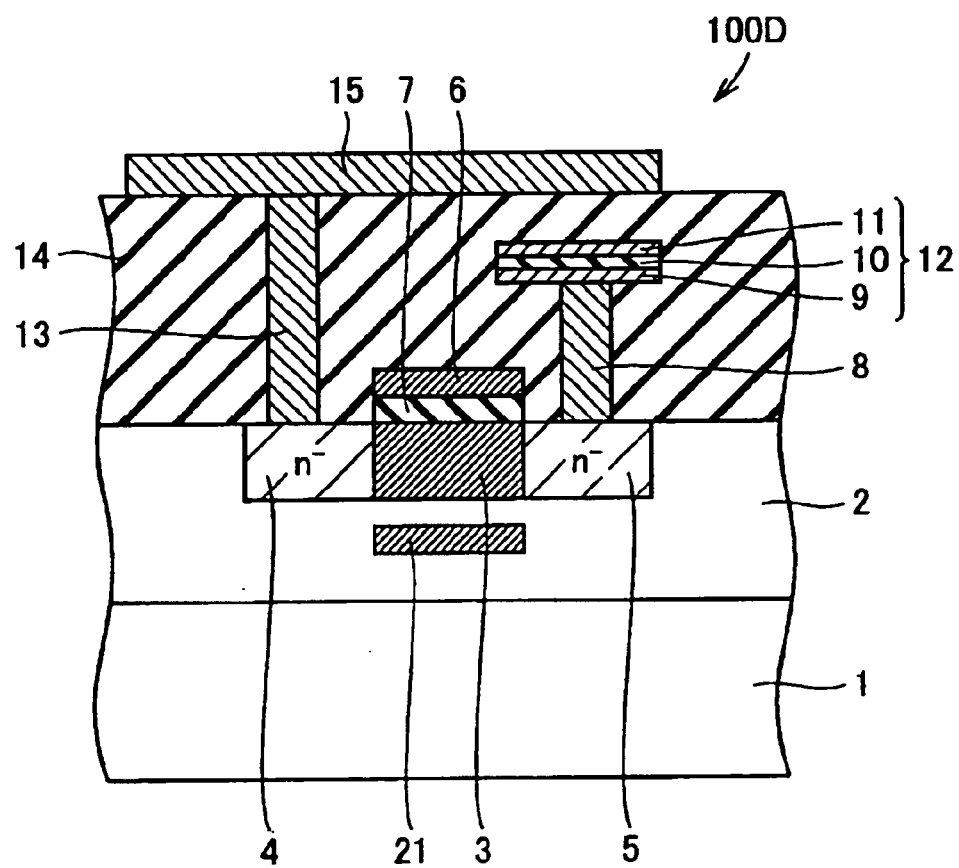
FIG. 29 is a cross-sectional view showing another structure of the conventional semiconductor device.
Figure 30:
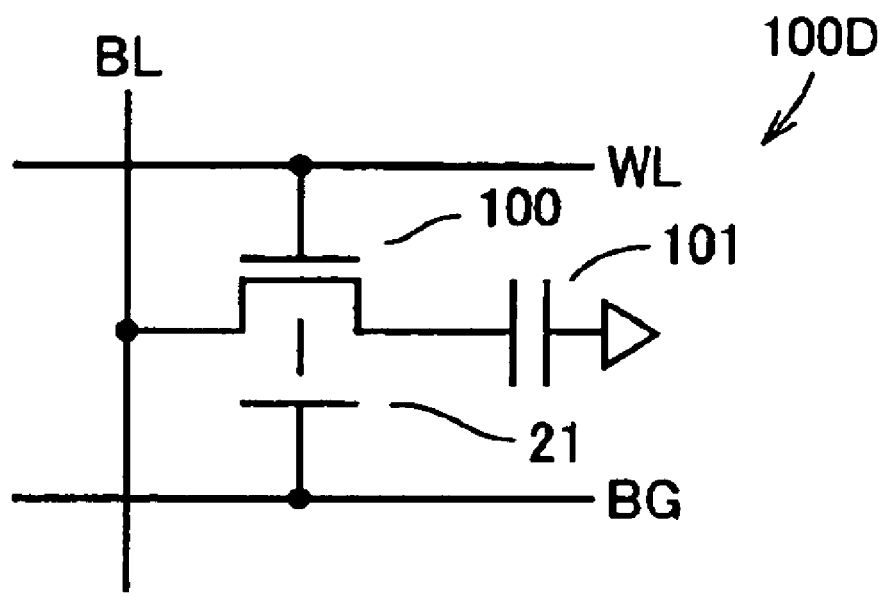
FIG. 30 is a circuit model diagram showing another conventional semiconductor device.

Body line BDL is as thin as word line WL and high in resistance. Therefore, the body section behaves like a region isolated by high resistance (see FIG. 24). Namely, as indicated by an operation waveform view shown in FIG. 25, the potential of the body section rises in response to the coupling of word lines WL. However, since the voltage of body line BDL is fixed to −1.0 V despite high resistance, the increased potential gradually falls to −1.0 V.

In other words, in a static state such as a standby state, the potential of the body section is fixed to such a high potential as −1.0 V and the floating of the potential of the body section does not occur. On the other hand, if word line WL is activated, the potential of only the body section of the selected cell momentarily floats, which contributes to high rate access operation.

In recent years, demand for DRAM which pays much attention to acceleration of random cycle such as an SRAM (Static Random Access Memory) cache has risen. Therefore, if it suffices that a word line activation period is short, it is possible to employ the above-stated configuration and operation.

That is, the semiconductor device according to the fifth embodiment similarly to that according to the first embodiment can attain both the advantage of the high rate operation of the SOI transistor and the advantage of the data holding characteristic of bulk DRAM. In addition, there is no need to provide a body line driver circuit, which contributes to the reduction of layout area.

According to the semiconductor device based on the present invention, the potential of the body section can be controlled by the body section control means, making it possible to solve the floating of the potential of the body section which has been the disadvantage of the conventional semiconductor SOI structure.

It is preferable that the semiconductor devices is a dynamic random access memory in which a plurality of memory cells each including the transistor are arranged in a matrix, the gate electrode consists of a word line, and that the embedded body line is arranged in parallel to the word line.

With this configuration, it is possible to solve the disadvantage of the floating of the potential of the body section as stated above. It is, therefore, possible to improve the reliability of the operation characteristic of the dynamic random access memory.

It is preferable that the embedded body line is connected to the body section of the transistor of each of the plurality of memory cells selected by the common word line. As a result, the body potentials of the other inactive memory cell transistors are floated to prevent the deterioration of the data holding characteristic. That is, it is possible to attain the data holding characteristic of the bulk type dynamic random access memory while maintaining the high rate characteristic of the SOI type transistor.

It is preferable that the adjacent embedded body lines are isolated from each other by an insulating film.

Further, it is preferable that the embedded body line consists of a wiring layer embedded into a deeper position than the pair of impurity regions in a depth direction of the insulating layer. With this configuration, there is no need to arrange the body line adjacent the active region of the memory cell transistor, making it possible to employ the embedded body line equal in shape to an ordinary word line. As a result, it is possible to realize the array configuration employed for ordinary DRAM cells without any problems.

It is preferable that the embedded body line is made of monocrystalline silicon or polycrystalline silicon.

It is also preferable that in the semiconductor device, the body section control means controls the body section to have a first potential when a potential applied to the word line is inactive and to have a second potential higher than the first potential when the potential applied to the word line is active.

By doing so, when the potential applied to the word line is inactive, the potential applied to the embedded body line is set at a low potential such as the first voltage (e.g., −1.0 V), thereby floating the potential of the body section by the floating body effect and solving the disadvantage of deteriorating the data holding characteristic. Further, when the potential applied to the word line is active, the potential applied to the embedded body line is set at the second potential (e.g., 0 V) higher than the first voltage to which the potential of the embedded body line is fixed in a standby state. This operation can decrease the threshold voltage (Vth) of the transistor, and improve the driving ability thereof. Thus, it can be expected to read and write data at high rate.

Furthermore, it is preferable that the first potential is not more than 0 V, and that the second potential is not less than 0 V.

It is also preferable that a potential of the body section is fixed to a first potential by the body section control means. By doing so, in a static state such as a standby state, for example, the potential of the body section is fixed to such a high potential as the first potential (e.g., −1.0 V) and the floating of the potential of the body section does not occur. When the word line is activated, the potential of only the body section of the selected cell momentarily floats, making it possible to contribute to high rate access operation.

According to the semiconductor device manufacturing method based on the present invention, it is possible to apply the ordinary semiconductor device manufacturing process to the method only by adding the first embedded body line formation process.

It is preferable that the step of reducing the thickness of the second silicon substrate includes a step of introducing hydrogen into a predetermined thickness of the second silicon substrate to break a wall of the second silicon substrate, and removing a substrate on an upper layer side.

It is also preferable that the step of reducing the thickness of the second silicon substrate includes a step of polishing a surface of the second silicon substrate by chemical mechanical polishing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device which comprises a transistor provided on a silicon substrate through an insulating layer and has a gate electrode provided on said insulating layer through a gate insulating film and a pair of impurity regions provided in said insulating layer, the semiconductor device comprising:

a body section including a region interposed between said pair of impurity regions and having a depth which is larger than a depth of said pair of impurity regions;

an embedded body line connected to said body section; and body section control means, which is connected to said embedded body line, for controlling a potential applied to said body section in relation to a potential applied to said gate electrode, wherein the semiconductor device is a dynamic random access memory in which a plurality of memory cells each including said transistor are arranged in a matrix, said gate electrode included a word line, and said embedded body line is arranged in parallel to and beneath said word line.

2. The semiconductor device according to claim 1, wherein said embedded body line is connected to said body section of said transistor of each of said plurality of memory cells selected by said common word line.

3. The semiconductor device according to claim 1, wherein adjacently embedded body lines are mutually isolated from each other by an insulating film.

4. The semiconductor device according to claim 1, wherein said embedded body line includes a wiring layer embedded into a deeper position than said pair of impurity regions in a depth direction of said insulating layer.

5. The semiconductor device according to claim 1, wherein said embedded body line is made of monocrystalline silicon or polycrystalline silicon.

6. The semiconductor device according to claim 1, wherein said body section control means controls said body section to have a first potential when a potential applied to said word line is inactive and to have a second potential higher than said first potential when the potential applied to said word line is active.

7. The semiconductor device according to claim 6, wherein said first potential is not more than 0 V, and said second potential is not less than 0 V.

8. The semiconductor device according to claim 1, wherein the potential of said body section is fixed to a first potential by said body section control means.

* * * * *